United States Patent
Dandia et al.

(10) Patent No.: US 10,636,736 B2
(45) Date of Patent: Apr. 28, 2020

(54) LAND PAD DESIGN FOR HIGH SPEED TERMINALS

(71) Applicant: Advanced Micro Devices, Inc., Santa Clara, CA (US)

(72) Inventors: Sanjay Dandia, San Jose, CA (US); Gerald R. Talbot, Concord, MA (US); Mahesh S. Hardikar, San Jose, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/836,239

(22) Filed: Dec. 8, 2017

(65) Prior Publication Data

US 2019/0181087 A1    Jun. 13, 2019

(51) Int. Cl.
| | |
|---|---|
| *H01L 23/522* | (2006.01) |
| *H01L 23/00* | (2006.01) |
| *H01L 23/528* | (2006.01) |
| *H01L 23/498* | (2006.01) |

(52) U.S. Cl.
CPC .... *H01L 23/5226* (2013.01); *H01L 23/49838* (2013.01); *H01L 23/528* (2013.01); *H01L 24/03* (2013.01); *H01L 24/89* (2013.01)

(58) Field of Classification Search
CPC ... H01L 23/5226; H01L 23/528; H01L 24/03; H01L 24/89; H01L 23/49838
USPC .................................................. 439/66, 951
See application file for complete search history.

(56) References Cited

U.S. PATENT DOCUMENTS

| | | | | |
|---|---|---|---|---|
| 5,966,020 | A * | 10/1999 | Rampone | G01R 31/048 324/756.05 |
| 6,115,260 | A * | 9/2000 | Nakajima | H05K 1/117 174/260 |
| 6,602,078 | B2 * | 8/2003 | Kwark | H01P 1/047 361/792 |
| 7,121,858 | B2 * | 10/2006 | Chen | G01R 1/0433 439/259 |

(Continued)

FOREIGN PATENT DOCUMENTS

JP    2008209237 A    2/2007

OTHER PUBLICATIONS

Chiappetta, M., "Build the ultimate Intel Haswell PC for under $1000," PCWorld, Jun. 5, 2013, 10 pages.

(Continued)

*Primary Examiner* — Travis S Chambers
(74) *Attorney, Agent, or Firm* — Zagorin Cave LLP

(57) ABSTRACT

An integrated circuit assembly includes an integrated circuit package substrate and a conductive land pad disposed on a surface of the integrated circuit package substrate. The conductive land pad comprises a conductor portion, an isolated conductor portion, and an isolation portion disposed between the conductor portion and the isolated conductor portion. The isolated conductor portion may surround a first side of the conductor portion and a second side of the conductor portion. The isolated conductor portion may surround a portion of a perimeter of the conductor portion. The isolation portion may include a gap between the conductor portion and the isolated conductor portion. The gap may have a width smaller than a radius of an interconnect structure of a receiving structure.

17 Claims, 5 Drawing Sheets

(56) References Cited

U.S. PATENT DOCUMENTS

| | | | |
|---|---|---|---|
| 7,196,907 B2* | 3/2007 | Zheng | H01R 13/2435 |
| | | | 361/760 |
| 7,314,268 B2* | 1/2008 | Aruga | B41J 2/17509 |
| | | | 347/49 |
| 9,466,900 B1 | 10/2016 | Heng et al. | |
| 9,633,914 B2* | 4/2017 | Call | H01L 24/83 |
| 2004/0016997 A1 | 1/2004 | Ushio | |
| 2004/0207090 A1 | 10/2004 | Farrar | |
| 2008/0285239 A1* | 11/2008 | Yun | H01L 23/4006 |
| | | | 361/720 |
| 2012/0176151 A1* | 7/2012 | Sherry | G01R 1/06716 |
| | | | 324/756.05 |
| 2013/0015592 A1 | 1/2013 | Kelkar et al. | |
| 2017/0055346 A1* | 2/2017 | Holec | H01R 4/02 |
| 2017/0077000 A1 | 3/2017 | Call et al. | |
| 2017/0250487 A1* | 8/2017 | Huang | H01R 13/2464 |

OTHER PUBLICATIONS

Intel, "Land Grid Array (LGA) Socket and Package Technology," Sep. 2009, 37 pages.

International Search Report and Written Opinion from International Application No. PCT/US2018/051539, dated Jan. 24, 2019, 11 pages.

* cited by examiner

LAND PAD DESIGN FOR HIGH SPEED TERMINALS

BACKGROUND

Description of the Related Art

In general, a Land Grid Array package (LGA) is a surface mount package for integrated circuits including conductive land pads that can be electrically coupled to pins or conductive leads of an LGA socket that is coupled to a printed circuit board or directly coupled to conductors on a printed circuit board. Conventional LGA land pads are square or rectangular and have a capacitance, which loads the associated terminal or signal path and may limit high speed performance of terminals coupled to the land pads. Accordingly, improved land pad techniques are desired.

SUMMARY OF EMBODIMENTS OF THE INVENTION

In at least one embodiment, an integrated circuit assembly includes an integrated circuit package substrate and a conductive land pad disposed on a surface of the integrated circuit package substrate. The conductive land pad comprises a conductor portion, an isolated conductor portion, and an isolation portion disposed between the conductor portion and the isolated conductor portion. The isolated conductor portion may surround a first side of the conductor portion and a second side of the conductor portion. The isolated conductor portion may surround a portion of a perimeter of the conductor portion. The isolation portion may include a gap between the conductor portion and the isolated conductor portion. The gap may have a width smaller than a radius of an interconnect structure of a receiving structure.

In at least one embodiment, a method for manufacturing an integrated circuit assembly includes forming a conductive layer on a surface of a multi-layer package substrate. The method includes forming a conductive land pad from the conductive layer. The conductive land pad has a conductor portion, an isolated conductor portion, and an isolation portion disposed between the conductor portion and the isolated conductor portion. The isolation portion may have a width smaller than a radius of a contact tip of an interconnection structure of a receiving structure. The isolation portion may include a gap between the conductor portion and the isolated conductor portion. The gap may be filled with an electrically insulating material.

In at least one embodiment, a method for manufacturing an integrated circuit assembly includes stacking an integrated circuit package and a receiving structure in a stack. A land side of the integrated circuit package is adjacent to and aligned with interconnection structures of the receiving structure, causing the interconnection structures to land on isolated conductor portions of corresponding land pads. The method includes traversing the receiving structure by the interconnection structures in response to a force exerted on the stack in a direction orthogonal to a surface of the land side. The traversing is in a direction parallel to the surface of the land side, from the isolated conductor portion of the corresponding land pads, across isolation portions of the corresponding land pads disposed between isolated conductor portions and conductor portions of the corresponding land pads, to the conductor portions of the corresponding land pads. The conductor portions may be separated from the corresponding isolated portions by a width smaller than a radius of the interconnection structure of the receiving structure.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

In general, a land grid array (LGA) package includes a multi-layer substrate formed by conventional packaging manufacturing techniques using a ceramic or plastic material (e.g., bismaleimide triazine (BT) substrate). The multi-layer substrate includes conductive layers used to redistribute signals within the substrate. The LGA package includes one or more contacts (i.e., land pads or conductive lands) on an underside of the LGA package. The conductive layers and land pads couple an integrated circuit housed by the LGA package to corresponding contacts on a receiving structure (e.g., a socket or printed circuit board). Typical land pads are flat or planar structures that may vary in size and pitch and are arranged in rectangular grids that may be located at the periphery of the package, or in other patterns on the underside of the LGA package.

Figure 1:
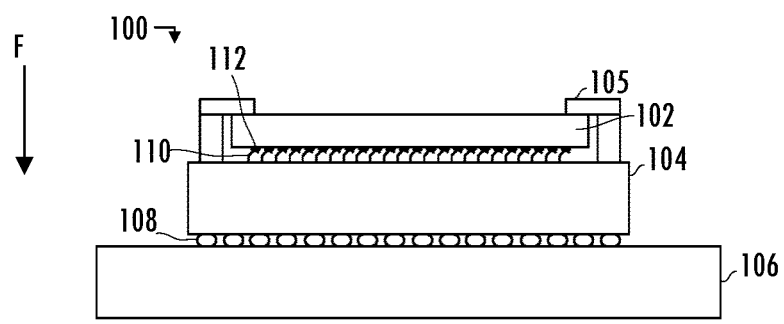
FIG. 1 illustrates a cross-sectional view of an integrated circuit assembly including an LGA package coupled to a printed circuit board using a socket.

A printed circuit board or a socket attached to a printed circuit board is a receiving structure that provides mechanical and electrical connections between the land pads of the LGA package and the printed circuit board. Referring to FIG. 1, integrated circuit socket 104 is coupled to electrical contacts on printed circuit board 106 by electrical contacts 108 (e.g., solder balls, pins, leads, or other type of electrical contacts). Integrated circuit socket 104 applies compression force F in response to a handle or surface plate 105 being put in place. If the printed circuit board itself is the receiving structure, a compression force is applied to the LGA package while attaching the LGA package to the printed circuit board (e.g., using solder paste). Compression force F, which is applied in a first direction (e.g., a vertical direction orthogonal to the underside of LGA package 102), causes a sliding action of interconnection structures 110 (e.g., pins, leads, or other electrical contacts) of integrated circuit socket 104 in a second direction (e.g., a direction orthogonal to the first direction and parallel to the underside of LGA package 102) across land pads 112 of LGA package 102. As referred to herein, contact wipe (or engagement wipe) is the relative motion between mating contact surfaces (e.g., a land pad and a corresponding interconnection structure) during contact engagement or insertion into a socket. Integrated circuit socket 104 is exemplary only and may have other designs and use different connection mechanisms. For example, integrated circuit socket 104 may be an LGA dual compression socket having contacts on the top and bottom of the socket. Electrical connection between LGA package 102 and integrated circuit socket 104 and between integrated circuit socket 104 and printed circuit board 106 are made using force application techniques or heatsink. In addition, rather than apply compression force F by integrated circuit socket 104 in response to a handle or surface plate 105 being put in place, in other embodiments of integrated circuit assembly 100, a heatsink is used to apply compression force F in the absence of a force application mechanism.

Figure 2:
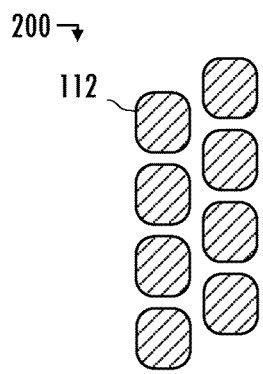
FIG. 2 illustrates a plan view of conventional land pads of an LGA package.
Figure 3:
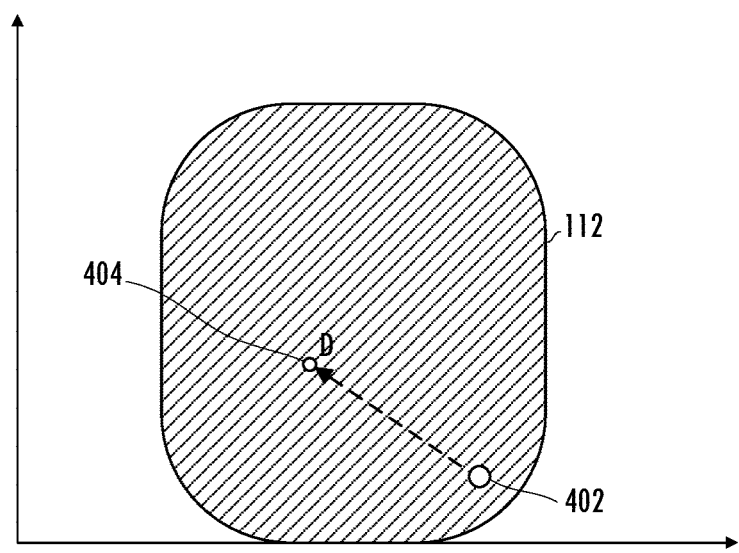
FIG. 3 illustrates a plan view of a contact wipe path across a conventional land pad in response to a force applied to an integrated circuit assembly including a conventional LGA package.
Figure 4:
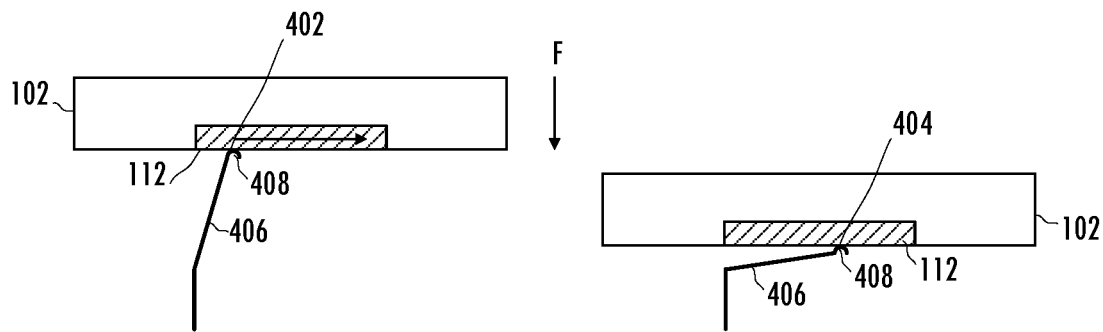
FIG. 4 illustrates cross-sectional views of a contact wipe path across a conventional land pad in response to a force applied to an integrated circuit assembly including a conventional LGA package.
Figure 5:
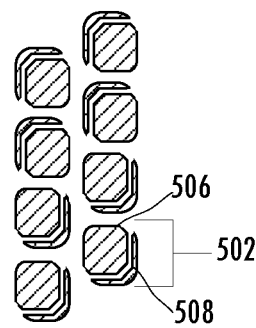
FIG. 5 illustrates a plan view of split LGA land pads consistent with at least one embodiment of the invention.
Figure 6:
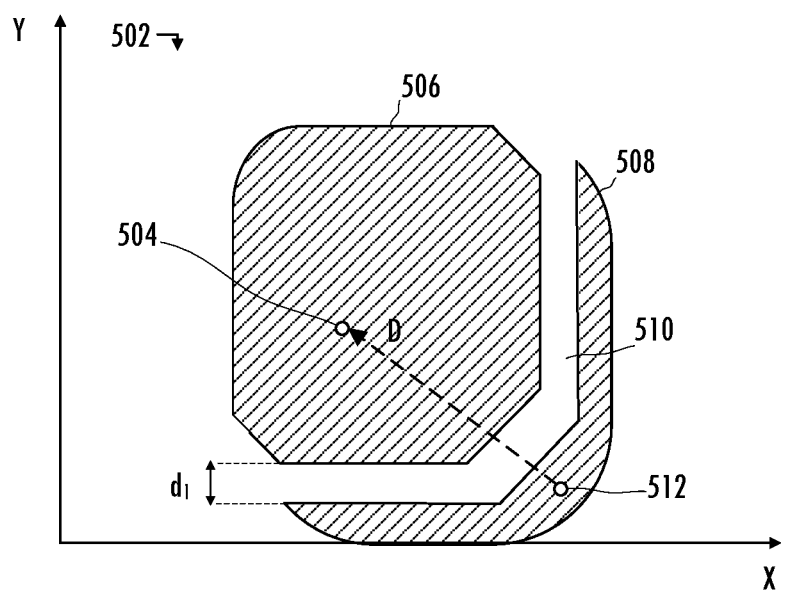
FIG. 6 illustrates a detailed plan view of a contact wipe path across a split LGA land pad consistent with at least one embodiment of the invention.
Figure 7:
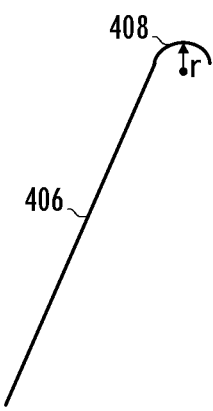
FIG. 7 illustrates an exemplary interconnection structure of a receiving structure for use with an LGA package.

Referring to FIGS. 2-4, land pad 112 is a conventional rectangular land pad formed as part of an array of land pads 200 on an underside of an integrated circuit package substrate. Land pad 112 is formed from a conductive material (e.g., gold-plated copper or gold-plated, nickel-plated copper) using conventional surface mount package manufacturing techniques, which may include conventional printed circuit board manufacturing technologies adapted for tighter geometries. An exemplary manufacturing technique forms land pads 112 by forming a dielectric layer on the underside of the integrated circuit package substrate, followed by conventional photolithographic patterning of a conductive layer formed above the dielectric layer.

Referring to FIGS. 3 and 4, during contact wipe, tip 408 of interconnection structure 406 initially lands at initial location 402 of land pad 112 and in response to compression force F, traverses land pad 112, following path D, to final position 404 on land pad 112. Path D is oblique to the sides of the land pad (e.g., travels at a 30-40 degree angle with respect to an edge of land pad 112). At final position 404, the entirety of land pad 112 contributes capacitance that loads the associated terminal. That capacitance limits high-speed performance of the terminal.

A technique that reduces capacitive loading of a land pad on an associated terminal includes a split land pad design that considers the contact wipe path of an interconnection structure across the land pad. The split land pad design improves the high-speed performance of the terminal, as compared to a conventional rectangular land pad of FIGS. 2-4. In at least one embodiment, a split land pad design includes separate land pad portions for an initial landing location of an interconnection structure on the land pad and a final landing location of the interconnection structure on the land pad. Referring to FIGS. 5-9, each split land pad 502 includes a conductor portion 506 that couples an interconnection structure at its final landing location to a signal of an integrated circuit housed by the LGA package, e.g., couples to a terminal of an integrated circuit housed by the LGA package. The interconnection structure electrically and mechanically connects to split land pad 502 at initial landing location 512 in isolated conductor portion 508 and at final landing location 504 within conductor portion 506. However, isolated conductor portion 508 is electrically isolated from conductor portion 506 and does not couple the interconnection structure to a signal of the integrated circuit housed by the LGA package, although it may be coupled to a voltage that reduces effects of the isolated conductor portion 506 on performance of split land pad 502 (e.g., isolated conductor portion 508 is coupled to a ground voltage and conductor portion 506 is connected to high-speed I/O). In at least one embodiment, isolated conductor portion 508 is formed from the same material as conductor portion 506, although it may be formed from another conductive material.

Isolated conductor portion 508 receives the interconnection structure at initial landing location 512, prior to contact wipe. Isolated conductor portion 508 is formed from a conductor material, which in some embodiments is the same material as conductor portion 506, so that any debris from isolated conductor portion 508 that collects on the interconnection structure as a result of traversing isolated conductor portion 508, is unlikely to interfere with establishing an electrical connection between the interconnection structure and conductor portion 506 at final landing location 504.

Figure 8:
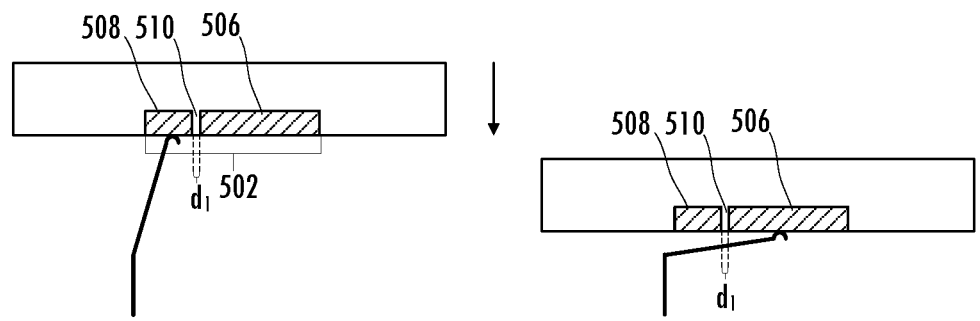
FIG. 8 illustrates cross-sectional views of a contact wipe path across a split land pad in response to a force applied to an integrated circuit assembly including a conventional LGA package consistent with at least one embodiment of the invention.
Figure 9:
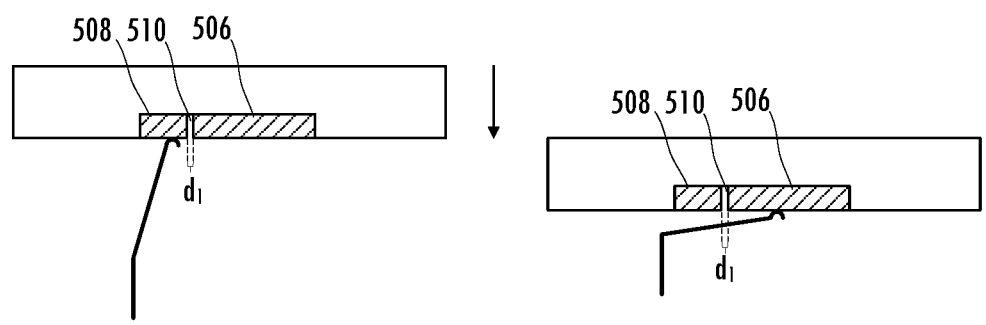
FIG. 9 illustrates cross-sectional views of a contact wipe path across another embodiment of a split land pad in response to a force applied to an integrated circuit assembly including a conventional LGA package consistent with at least one embodiment of the invention.

Split land pad 502 also includes isolating portion 510 between conductor portion 506 and isolated conductor portion 508. Isolating portion 510 is a physical barrier that provides electrical isolation between conductor portion 506 and isolated conductor portion 508. Isolating portion 510 may be a gap filled with an electrically insulating material (e.g., air or solder resist) between conductor portion 506 and isolated conductor portion 508 (FIG. 9) or may be filled with another low relative permittivity (i.e., low dielectric constant) material (e.g., a solder resist, polyimide solder mask, or other material having a relative permittivity of less than 10.0 as illustrated in FIG. 8). In general, isolating portion 510 has a width that is wide enough to provide sufficient electrical isolation, but narrow enough to reduce or eliminate debris build-up on tip 408 of interconnection structure 406. In at least one embodiment, width di (e.g., 50 microns or less) is narrower than 50% of radius r (e.g., radius r=100 microns) of tip 408 of interconnection structure 406. Accordingly, tip 408 of interconnection structure 406 glides over the trench during contact wipe.

An exemplary manufacturing technique forms split land pads 502 by first forming a dielectric layer on the underside of the integrated circuit package substrate, followed by conventional photolithographic patterning to form the split pad structure. For example, a conductive layer (e.g., a copper layer) is formed on the package surface. Then, the conductive layer is plated with another conductive material (e.g., gold). A photoresist is applied and a reticle including the split land pad pattern is used to selectively expose the photoresist material and unwanted material is removed (e.g., etched away). Instead of a subtractive patterning process, an additive patterning process may be used to form conductive structures only in regions that need the material may be used. In addition, rather than require complete redesign of reticles designed for conventional land pads, a separate additional reticle and associated patterning steps may be used to form isolation structures in corresponding preformed land pads. Split land pads may be formed as solder mask defined land pads, which have a solder mask opening smaller than the land pad. In other embodiments, the split land pads are on-solder mask defined land pads, which have a split land pad smaller than the solder mask opening. In at least one embodiment, the split land pads are formed using a copper etch process. The split land pads may be finished with a solderability coating.

Figure 10:
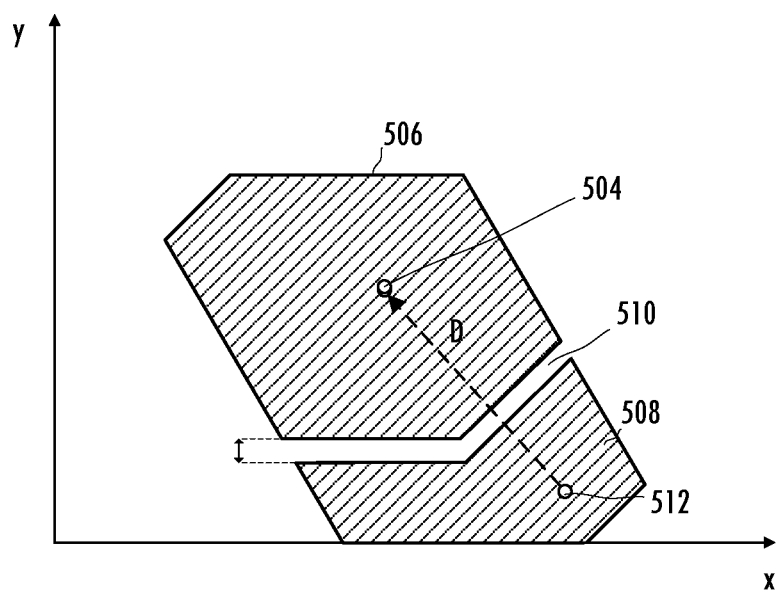
FIG. 10 illustrates a detailed plan view of a contact wipe path across another embodiment of a split LGA land pad consistent with at least one embodiment of the invention.
Figure 11:
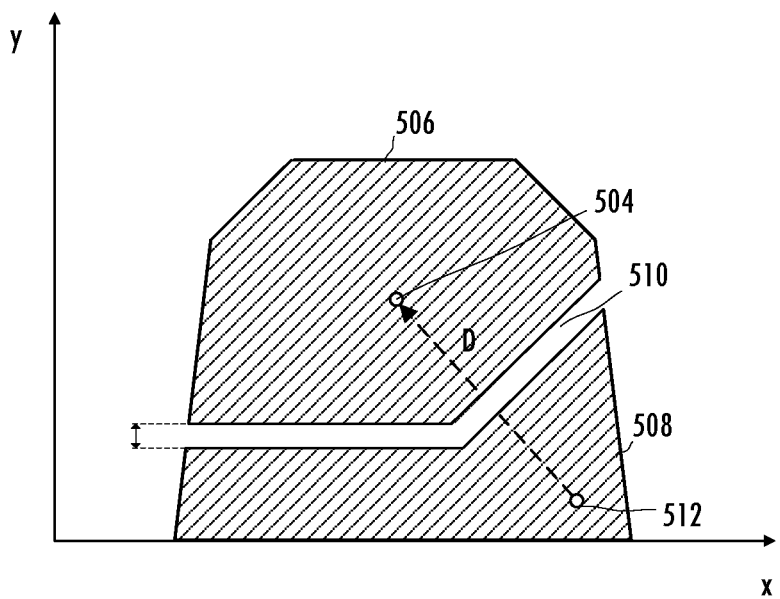
FIG. 11 illustrates a detailed plan view of a contact wipe path across another embodiment of a split LGA land pad consistent with at least one embodiment of the invention.

In an exemplary package technology, the split pad structure substantially reduces the effective land pad area (i.e., the area of conductive material contributing to capacitive loading of the associated terminal, e.g., from approximately 670 $mm^2$ to approximately 335 $mm^2$, a reduction of approximately 50%) and reduces the associated capacitive loading of the corresponding signal line (e.g., from 0.49 pF to 0.19 pF, a reduction of approximately 61%). Note that other land pad shapes and geometries may be used. For example, rather than form conductor portion 506 and isolated conductor portion 508 from a rectangular land pad, a split land pad having an isolated conductor portion and a conductor portion separated by isolating portion 510 may be formed from a rhombus-shaped land pad (e.g., FIG. 10), a trapezoidal-shaped land pad (e.g., FIG. 11), or other regular or irregular shape tailored to an angle and distance of contact wipe from an initial landing point on an isolated conductor portion to a final landing point on a conductor portion. Tailoring may include providing minimum dimensions for a conductor portion based on the distance D and a predetermined range of angles of the contact wipe. Corners may be reduced consistent with manufacturing design rules (e.g., by forming conductors having edges of 45 degree angles or rounded corners) to further reduce the area of the conductor portion of the split land pad and thus further reduce capacitive loading. Note that if the wipe angle is standardized across manufacturers of a target receiving structure (e.g., limited to an angle range less than 10 degrees), the geometry of conductive portion 506 may be further tailored according to the wipe angle, thereby further reducing capacitance of split land pad 502.

Figure 12:
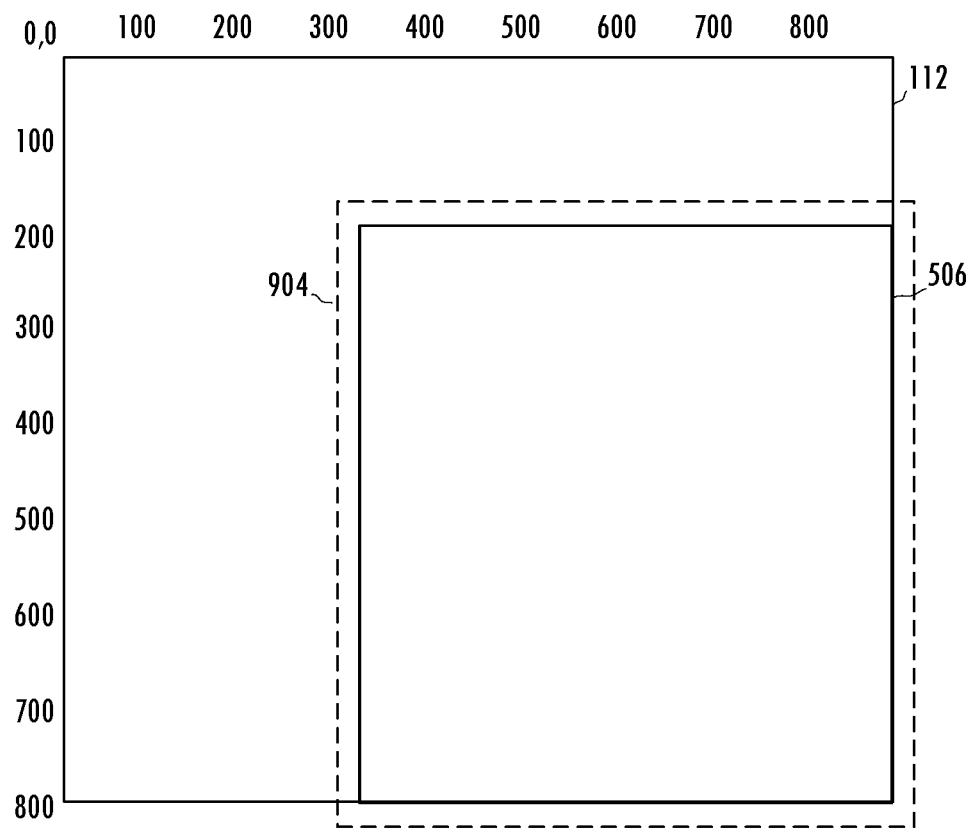
FIG. 12 illustrates an area of conductive material contributing to capacitance of a conventional LGA land pad and area of conductive material contributing to capacitance of a split LGA land pad consistent with at least one embodiment of the invention.
Figure 13:
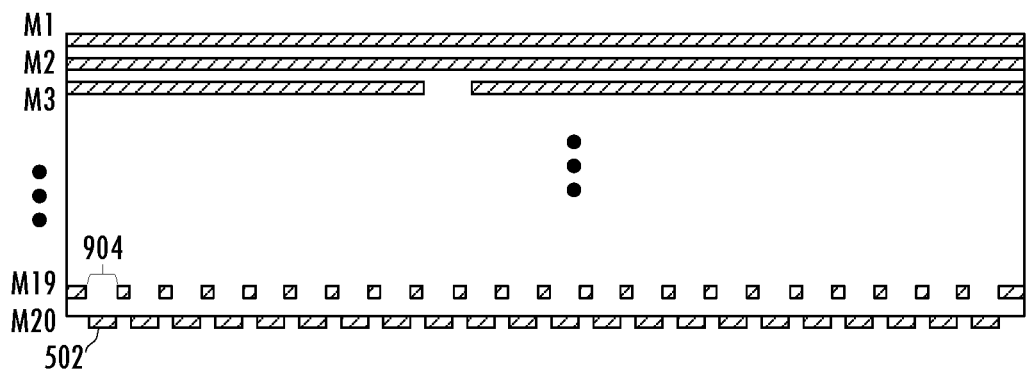
FIG. 13 illustrates an area of conductive material exemplary cross-sectional view of an integrated circuit package substrate consistent with at least one embodiment of the invention.

Referring to FIGS. 12 and 13, in at least one embodiment, the split land pads are formed in a last conductive layer of a multi-layer package substrate (e.g., conductive layer M20 of a 20-layer package). Another technique that may be used to reduce the capacitance of individual split land pads includes removing conductor material in a next adjacent conductive layer (e.g., conductive layer M19) above split land pads 502 of the multilayer package. For example, voids 904 may be formed in a penultimate conductive layer (e.g., conductive layer M19) using patterning techniques described above. The voids may have the same size and shape of an outer perimeter of the split land pads formed in conductive layer M20 and are aligned with split land pads of conductive layer M20.

The description of the invention set forth herein is illustrative, and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. An integrated circuit assembly comprising:
   an integrated circuit package substrate; and
   a conductive land pad disposed on a surface of the integrated circuit package substrate,
      wherein the conductive land pad comprises:
         a conductor portion configured as a final landing location of an interconnection structure;
         an isolated conductor portion configured as an initial landing location of the interconnection structure, the isolated conductor portion being electrically coupled to the interconnection structure when the interconnection structure is in the initial landing location and being electrically isolated from the interconnection structure when the interconnection structure is in the final landing location; and
      an isolation portion disposed between the conductor portion and the isolated conductor portion,
      wherein the isolation portion comprises a gap between the conductor portion and the isolated conductor portion, and
      wherein the gap is filled with an electrically insulating solid material.

2. The integrated circuit assembly, as recited in claim 1, wherein the isolated conductor portion surrounds a first side of the conductor portion and a second side of the conductor portion.

3. The integrated circuit assembly, as recited in claim 1, wherein the gap is filled with solder resist.

4. The integrated circuit assembly, as recited in claim 1, wherein the gap has a width smaller than a radius of the interconnection structure.

5. The integrated circuit assembly, as recited in claim 1, wherein the conductor portion is rectangular with oblique or rounded corners.

6. The integrated circuit assembly, as recited in claim 1, further comprising:
   the interconnection structure electrically coupled to the conductor portion of the conductive land pad and in direct contact with the conductor portion of the conductive land pad when the interconnection structure is in the final landing location and in direct contact with the isolated conductor portion when the interconnection structure is in the initial landing location.

7. The integrated circuit assembly, as recited in claim 1, further comprising:
   an integrated circuit socket configured to mechanically and electrically couple the conductor portion of the conductive land pad to a printed circuit board, using the interconnection structure.

8. The integrated circuit assembly, as recited in claim 1, further comprising:
   the interconnection structure in direct contact with the conductor portion when the interconnection structure is in the final landing location and in direct contact with the isolated conductor portion when the interconnection structure is in the initial landing location; and
   a printed circuit board directly attached to the interconnection structure.

9. The integrated circuit assembly, as recited in claim 1, further comprising:
an integrated circuit housed by the integrated circuit package substrate, the integrated circuit being electrically coupled to the conductor portion, and electrically isolated from the isolated portion,
wherein the conductor portion is configured to electrically couple a signal of the integrated circuit to the interconnection structure and the isolated conductor portion is configured to be electrically isolated from signals of the integrated circuit or coupled to a voltage that reduces effects of the isolated conductor portion on performance of the conductive land pad.

10. The integrated circuit assembly, as recited in claim 1, wherein the isolated conductor portion surrounds a portion of a perimeter of the conductor portion.

11. The integrated circuit assembly, as recited in claim 10, wherein the portion of the perimeter is at least 25% of the perimeter and less than 50% of the perimeter.

12. A method for manufacturing an integrated circuit assembly comprising:
forming a conductive layer on a surface of a multi-layer package substrate; and
forming a conductive land pad from the conductive layer, the conductive land pad having a conductor portion, an isolated conductor portion, and an isolation portion disposed between the conductor portion and the isolated conductor portion, wherein the conductive land pad has a shape based on an angle and distance of contact wipe of an interconnection structure relative to the conductive land pad; and
forming a void in a next adjacent conductive layer of the multi-layer package substrate, the void being directly beneath the conductive land pad.

13. The method, as recited in claim 12, wherein the isolation portion has a width smaller than a radius of a contact tip of the interconnection structure of a receiving structure.

14. The method, as recited in claim 12, wherein the isolation portion comprises a gap between the conductor portion and the isolated conductor portion and the gap is filled with an electrically insulating material.

15. A method for manufacturing an integrated circuit assembly comprising:
stacking an integrated circuit package and a receiving structure in a stack, a land side of the integrated circuit package adjacent to and aligned with interconnection structures of the receiving structure, causing the interconnection structures to land on isolated conductor portions of corresponding land pads; and
traversing the receiving structure by the interconnection structures in response to a force exerted on the stack in a direction orthogonal to a surface of the land side, the traversing being in a direction parallel to the surface of the land side, from the isolated conductor portions of the corresponding land pads, across isolation portions of the corresponding land pads disposed between isolated conductor portions and conductor portions of the corresponding land pads, to the conductor portions of the corresponding land pads.

16. The method, as recited in claim 15, wherein the interconnection structures traverse the receiving structure obliquely with respect to a side of the corresponding land pads.

17. The method, as recited in claim 15, wherein the conductor portions are separated from the isolated conductor portions of the corresponding land pads by a width smaller than a radius of the interconnection structures of the receiving structure.

* * * * *